United States Patent
Hashemi et al.

(10) Patent No.: US 6,512,285 B1
(45) Date of Patent: Jan. 28, 2003

(54) HIGH INDUCTANCE INDUCTOR IN A SEMICONDUCTOR PACKAGE

(75) Inventors: Hassan S. Hashemi, Mirandela, CA (US); Roberto Coccioli, Thousand Oaks, CA (US); Siamak Fazelpour, San Diego, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/972,706

(22) Filed: Oct. 5, 2001

(51) Int. Cl.[7] ............................................... H01L 29/00
(52) U.S. Cl. ....................................................... 257/531
(58) Field of Search ................................. 257/531, 516; 361/821, 748

(56) References Cited

U.S. PATENT DOCUMENTS

| | | | | |
|---|---|---|---|---|
| 3,614,554 A | * | 10/1971 | Shield et al. ................ | 317/235 |
| 6,249,039 B1 | * | 6/2001 | Harvey et al. ............... | 257/531 |
| 6,310,393 B1 | * | 10/2001 | Ogura et al. ................ | 257/723 |
| 6,445,271 B1 | * | 9/2002 | Johnson ...................... | 336/200 |
| 6,462,950 B1 | * | 10/2002 | Pohjonen .................... | 361/704 |

* cited by examiner

*Primary Examiner*—Carl Whitehead, Jr.
*Assistant Examiner*—William C Vesperman
(74) *Attorney, Agent, or Firm*—Farjami & Farjami LLP

(57) ABSTRACT

According to one embodiment, a number of trace metal segments or conductors are patterned onto a top surface of a substrate suitable for receiving and housing a semiconductor die. In one embodiment, an insulator layer covers the trace metal segments and separates them from a high permeability core which is mounted on top of the insulator layer. The insulator layer can comprise, for example, solder mask while the high permeability core can comprise, for example, a ferrite rod. In one embodiment, a number of bonding wires are passed over the high permeability core and make connections to respective trace metal segments under the core so as to create an inductor winding around the core. The terminals of the inductor so formed can be connected to a substrate bond pad and/or to a semiconductor die bond pad.

22 Claims, 2 Drawing Sheets

HIGH INDUCTANCE INDUCTOR IN A SEMICONDUCTOR PACKAGE

BACKGROUND OF THE INVENTION

1. Field of the Invention

The present invention is generally in the field of inductor fabrication. More specifically, the present invention is in the field of inductor fabrication on a package substrate of a semiconductor chip.

2. Background Art

The requirement of smaller, more complex, and faster devices operating at high frequencies, such as wireless communications devices and Bluetooth RF transceivers, has also resulted in an increased demand for small size inductors with high inductance. These small wireless communication devices and Bluetooth RF transceivers require small size inductors with high inductance for use in resonator circuits, filters, and switch regulators. For example, highly efficient switch regulators that need to work in the high KHz to low MHz range require inductors in a range of 100.0 nano henries ("nH") to 10.0 micro henries ("µH"). Also, the highly efficient switch regulators require inductors to have an inductance value with a tolerance of +/−10%.

One attempt to satisfy the demand for the small size inductors with a high inductance discussed above has been to integrate the inductor on a substrate that houses a chip. Inductors with an inductance on the order of 1.0 to 3.0 nH, and even as high as 10.0 nH can be integrated on a substrate that houses a chip. However, inductors with an inductance in the range of 100.0 nano henries ("nH") to 10.0 micro henries ("µH") discussed above are too large to be integrated on a substrate that also houses a chip.

Another attempt to satisfy the demand for inductors with a small size and high inductance discussed above has been to use discrete inductors. However, discrete inductors suffer from various disadvantages not shared by inductors that are integrated on a substrate the houses a chip. For example, the discrete inductor requires the assembly of at least two components, i.e. the chip itself and the discrete inductor. The required assembly of two or more components introduces corresponding reliability issues and also results in a greater manufacturing cost.

Additionally, a discrete inductor typically has a fixed inductance that is not tunable or adjustable. Thus, a discrete inductor must have the specific inductance required in a particular circuit. If the value of the required inductance changes, the discrete inductor must be removed from the circuit and replaced with another discrete inductor having the new required inductance. For example, to obtain a specific resonance frequency in the development phase of a LC test circuit, the determination of exact value of the required inductance could require the removal and replacement of numerous discrete inductors before arriving at a discrete inductor with the required inductance.

Thus, there exists a need in the art for a structure for integrating an inductor on a package substrate of a chip that provides an inductor with a small size and an inductance in the range of 100.0 nH to 10.0 µH. Moreover, there exists a need in the art for a structure for integrating an inductor on a package substrate of a chip that allows the value of the inductance to be tuned to meet a specific requirement. Further, there exists a need in the art for a structure for integrating an inductor on a package substrate of a chip that provides the flexibility to meeting different size requirements.

SUMMARY OF THE INVENTION

The present invention is directed to a high inductance inductor in a semiconductor package. According to one embodiment, a number of trace metal segments or conductors are patterned onto a top surface of a substrate suitable for receiving and housing a semiconductor die. In one embodiment, an insulator layer covers the trace metal segments and separates them from a high permeability core which is mounted on top of the insulator layer. The insulator layer can comprise, for example, solder mask while the high permeability core can comprise, for example, a ferrite rod.

In one embodiment, a number of bonding wires are passed over the high permeability core and make connections to respective trace metal segments under the core so as to create an inductor winding around the core. The terminals of the inductor so formed can be connected to a substrate bond pad and/or to a semiconductor die bond pad. Due to the high permeability of the core, the inductance value of the inductor so formed can be quite high while the inductor has a relatively small size. Moreover, the present invention's inductor can be fine-tuned by adjusting the number of bonding wires in the inductor winding and also by adjusting the length of the high permeability core.

DETAILED DESCRIPTION OF THE INVENTION

The present invention is directed to a high inductance inductor in a semiconductor package. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
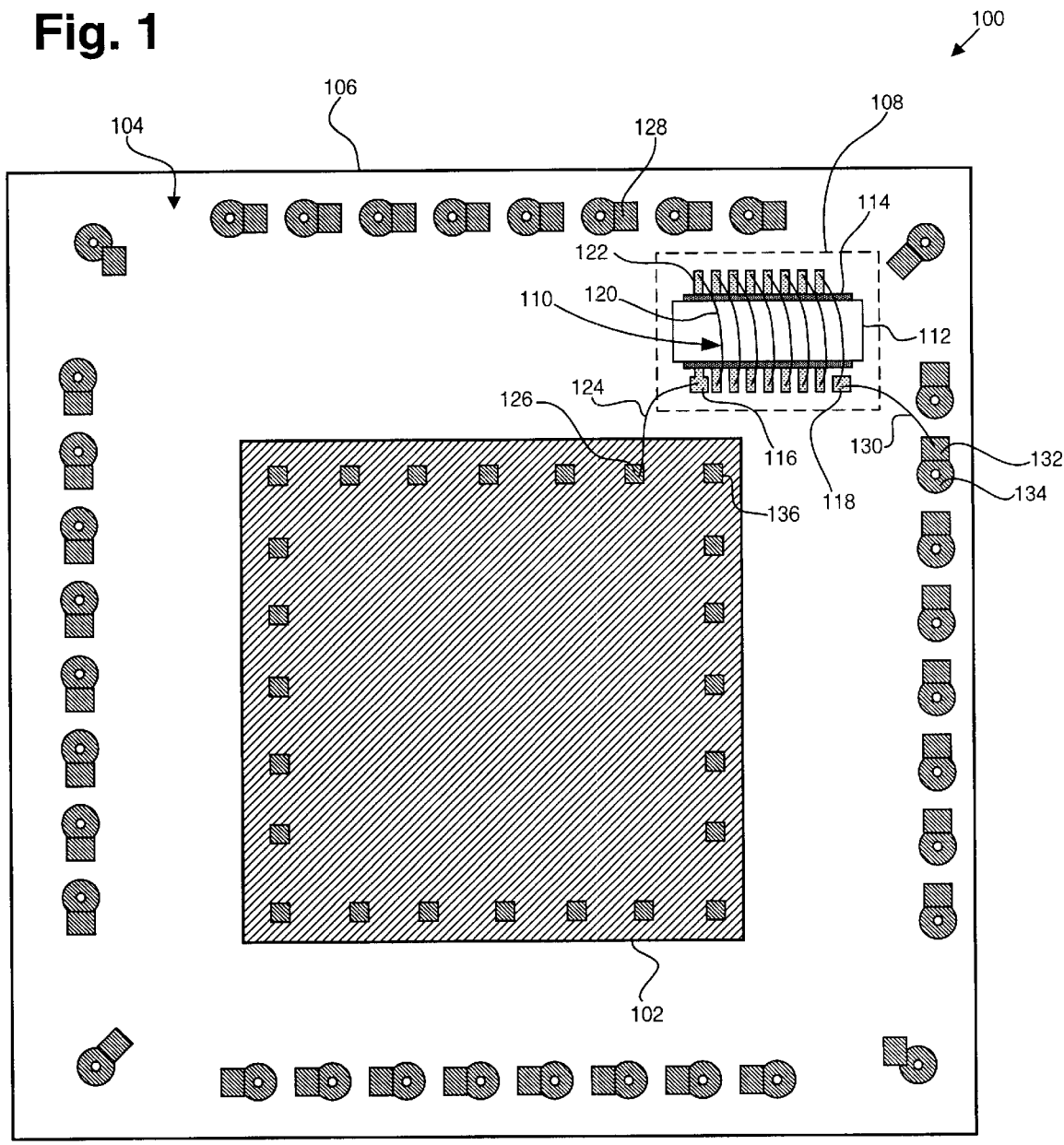
FIG. 1 illustrates a top view of an exemplary structure in accordance with one embodiment of the present invention.

Structure 100 in FIG. 1 illustrates a top view of an exemplary structure in accordance with one embodiment of the present invention. Structure 100 includes semiconductor die 102, which can be attached to top surface 104 of substrate 106 in a manner know in the art. It is noted that a "semiconductor die," such as semiconductor die 102, is also referred to as a "chip" or a "semiconductor chip" in the present application. Substrate 106 "houses" semiconductor die 102, and can comprise, for example, an organic laminate material or a ceramic material. It is also noted that a "substrate," such as substrate 106, is also referred to as a "package substrate" in the present application. However, in one embodiment, substrate 106 may be a printed circuit board ("PCB").

Structure 100 also includes inductor 108, which is situated, or "housed," on top surface 104 of substrate 106. In other embodiments, inductor 108 may be housed in a pin grid array package, a ball grid array package, a land grid array package, or on a laminate PCB. The package or laminate materials might comprise, for example, various ceramic or organic materials known in the art. Inductor 108 comprises winding 110, core 112, insulator 114, substrate bond pad 116, also referred to as a "terminal" of inductor 108 in the present application, and substrate bond pad 118, also referred to as a "terminal" of inductor 108 in the present application.

Winding 110 further comprises bonding wires, such as bonding wire 120, and trace metal segments, such as trace metal segment 122. It is also noted that a "trace metal segment," such as trace metal segment 122, is also referred to as a "conductor" in the present application. Trace metal segment 122 is fabricated on top surface 104 of substrate 106. For example, a mask can be used to pattern conductors on a copper metallization layer on top surface 104 of substrate 106. The excess copper can be etched away, resulting in a defined metal trace pattern that can include, for example, trace metal segment 122. Winding 110 is also referred to as an "inductor winding" in the present application.

In structure 100, trace metal segment 122 can comprise nickel-plated copper. Trace metal segment 122 can further comprise a layer of gold plating over the nickel-plated copper to provide a surface for wire bonding. A first end of trace metal segment 122 is connected to substrate bond pad 116, and a second end of trace metal segment 122 is connected to bonding wire 120. Similar to trace metal segment 122, substrate bond pad 116 can be fabricated on top surface 104 of substrate 106, and can comprise nickel-plated copper. Substrate bond pad 116 can also further comprise a layer of gold plating over the nickel-plated copper to provide a surface for wire bonding.

Bonding wire 120 can comprise gold or can comprise other metals such as aluminum. The diameter of bonding wire 120 can be approximately 1.0 mil to 6.0 mils. For example, in an application where inductor 108 provides filtering for a high-current voltage regulator, the diameter of bonding wire 120 can be approximately 6.0 mils. By way of further example, in an application where inductor 108 is used with a low-current micro module, the diameter of bonding wire 120 can be approximately 1.0 mil. Winding 110 will be discussed in greater detail in relation to FIG. 2.

Continuing with FIG. 1, insulator 114, also referred to as an "insulator layer" in the present application, is situated under core 112 so as to electrically insulate core 112 from trace metal segments such as trace metal segment 122. Insulator 114 can be a nonconducting material such as solder mask. In one embodiment, insulator 114 can be solder mask comprised of AUS-5. As shown in FIG. 1, bonding wires, such as bonding wire 120, pass over core 112 and do not make contact with core 112. In the present embodiment, core 112 can comprise a high permeability material such as a ferrite rod. By way of background, ferrite is a powdered, compressed, and sintered magnetic compound composed of iron oxide, a metallic oxide such as zinc, nickel, cobalt, or iron, and ceramic. Instead of a ferrite rod, any other high or medium permeability material suitable for increasing inductance can also be used.

The particular metallic oxide (for example, zinc, nickel, cobalt, or iron) that is used to form the ferrite rod affects the permeability of the ferrite rod, which can be, for example, approximately 40.0 to 100.0. Since the inductance of an inductor is proportional to the permeability of its core, the inductance of inductor 108 can be increased approximately 40.0 times if core 112 comprises a ferrite rod with a permeability of 40.0. Core 112 will be discussed in greater detail in relation to FIG. 2.

Continuing with FIG. 1, a first end of bonding wire 124 is bonded to substrate bond pad 116 of inductor 108, and a second end of bonding wire 124 is bonded to semiconductor die bond pad 126. Bonding wire 124 can be gold or can comprise other metals such as aluminum. The diameter of bonding wire 124 can be 30.0 microns or other diameter of choice. Bonding wire 124 electrically connects substrate bond pad 116 of inductor 108, i.e. a terminal of inductor 108, to semiconductor die bond pad 126. In to another embodiment, a bonding wire can electrically connect substrate bond pad 116 of inductor 108 to another substrate bond pad on the periphery of top surface 104, such as substrate bond pad 128.

As shown in FIG. 1, a first end of bonding wire 130 is bonded to substrate bond pad 118 of inductor 108, and a second end of bonding wire 130 is bonded to substrate bond pad 132. Bonding wire 130 can be comprised of similar material as bonding wire 124 discussed above. Substrate bond pads 118, 128, and 132 can be fabricated on top surface 104 of substrate 106 in a similar manner as substrate bond pad 116 discussed above. Substrate bond pads 118, 128, and 132 can also comprise the same material as substrate bond pad 116.

Bonding wire 130 electrically connects substrate bond pad 118 of inductor 108, i.e. a terminal of inductor 108, to substrate bond pad 132, which "abuts" via 134. Thus, bonding wire 130 can, in one embodiment, electrically connect substrate bond pad 118 of inductor 108 to a land (not shown in FIG. 1) that is connected to via 134 on the bottom surface of substrate 106 by way of substrate bond pad 132 and via 134. In a different embodiment, a bonding wire can electrically connect substrate bond pad 118 of inductor 108 to a semiconductor die bond pad, such as semiconductor die bond pad 136 on semiconductor die 102. In another embodiment, a bonding wire can connect substrate bond pad 116 or substrate bond pad 118 to a component on top surface 104 of substrate 106, such as a capacitor. It is noted that in FIG. 1, only trace metal segment 122, bonding wire 120, substrate bond pads 128 and 132, via 134, and semiconductor die bond pads 126 and 136 are specifically discussed herein to preserve brevity.

Figure 2:
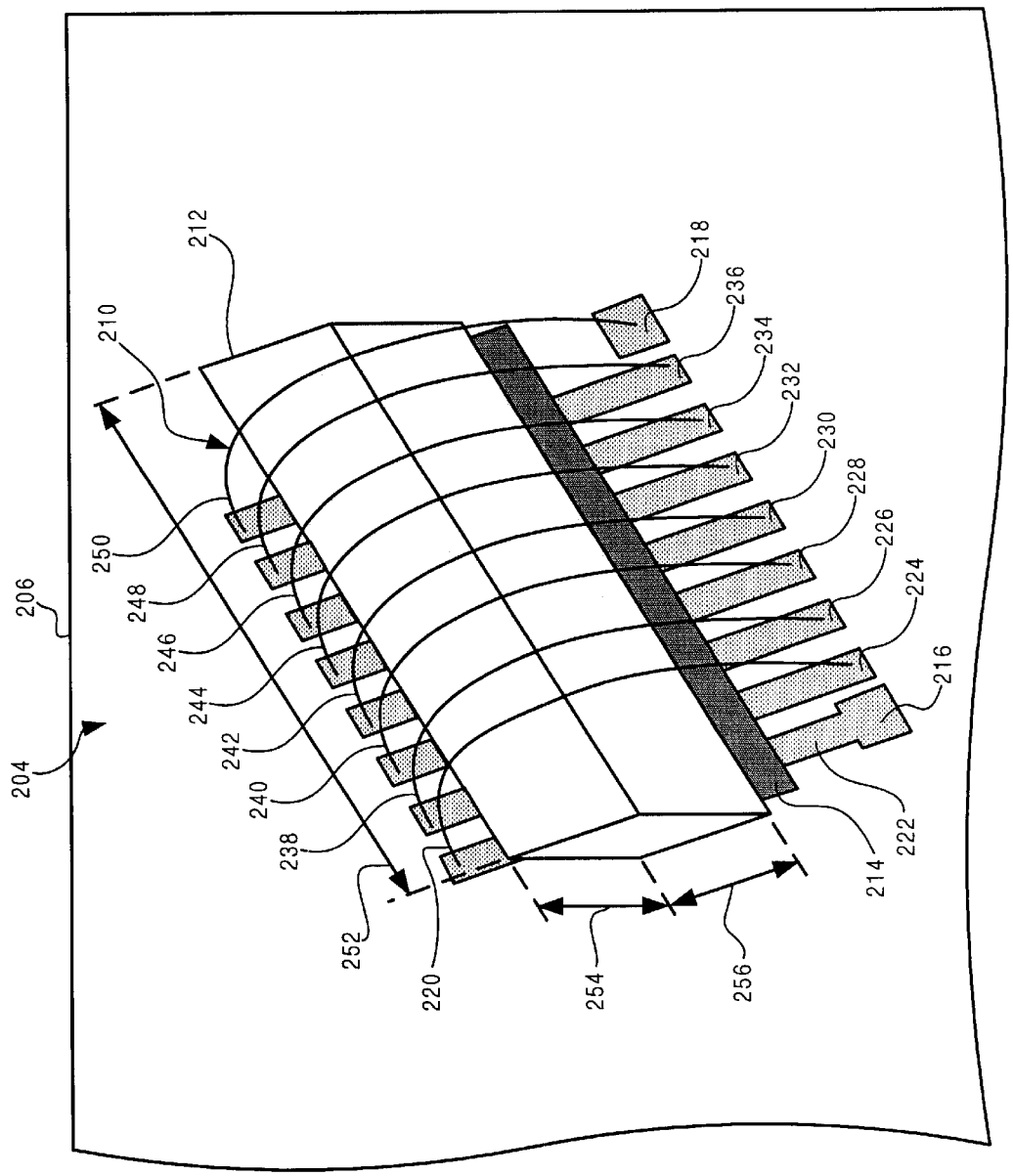
FIG. 2 illustrates a perspective view of an embodiment of the present invention.

Referring now to FIG. 2, inductor 208 illustrates a perspective view of an exemplary inductor in accordance with one embodiment of the present invention. Inductor 208 corresponds to inductor 108 in FIG. 1. In particular, core 212, winding 210, insulator 214, substrate bond pad 216, substrate bond pad 218, trace metal segment 222, and bonding wire 220, respectively, correspond to core 112, winding 110, insulator 114, substrate bond pad 116, substrate bond pad 118, trace metal segment 122, and bonding wire 120 in FIG. 1.

Now discussing FIG. 2 in more detail, winding 210 comprises trace metal segments 222, 224, 226, 228, 230, 232, 234, and 236, and bonding wires 220, 238, 240, 242, 244, 246, 248, and 250. Trace metal segments 222, 224, 226, 228, 230, 232, 234, and 236 are similar to trace metal segment 122 in FIG. 1 and are fabricated on top surface 204 of substrate 206 in a similar manner as trace metal segment 122 described above. Winding 210 is also referred to as an "inductor winding" in the present application.

Continuing with FIG. 2, the first ends of bonding wires 220, 238, 240, 242, 244, 246, 248, and 250, respectively, are connected to the first ends of trace metal segments 222, 224, 226, 228, 230, 232, 234, and 236. The second ends of bonding wires 220, 238, 240, 242, 244, 246, 248, and 250, respectively, are connected to the second ends of trace metal segments 224, 226, 228, 230, 232, 234, and 236, and substrate bond pad 218, also referred to as a "terminal" of inductor 208 in the present application.

In the present embodiment, first ends of bonding wires 220, 238, 240, 242, 244, 246, 248, and 250, respectively, can be connected to the first ends of trace metal segments 222, 224, 226, 228, 230, 232, 234, and 236 by bonding. Similarly, the second ends of bonding wires 220, 238, 240, 242, 244, 246, 248, and 250, respectively, can be connected to the second ends of trace metal segments 224, 226, 228, 230, 232, 234, and 236, and substrate bond pad 218 by bonding.

Bonding wires 220, 238, 240, 242, 244, 246, 248, and 250 are similar to bonding wire 120 in FIG. 1, and comprise the same material as bonding wire 120, such as gold or aluminum. The diameter of bonding wires 220, 238, 240, 242, 244, 246, 248, and 250 can be approximately 1.0 mil to 6.0 mils. Trace metal segments 222, 224, 226, 228, 230, 232, 234, and 236 can comprise nickel-plated copper. Trace metal segments 222, 224, 226, 228, 230, 232, 234, and 236 can further comprise a layer of gold plating over the nickel-plated copper to provide a surface for wire bonding.

Continuing with FIG. 2, each trace metal segment of winding 210 and the bonding wire connected to the first end of the trace metal segment form a "turn" of winding 210. For example, trace metal segment 222 and bonding wire 220 that is connected to the first end of trace metal segment 222 as discussed above form one "turn" of winding 210. The inductance of an inductor is generally proportional to the square of the number of "turns" in the inductor's winding. Thus, the inductance of inductor 208 can be increased or decreased by increasing or decreasing the number of "turns" in winding 210. For example, adding trace metal segments and bonding wires to winding 4 210 can increase the number of "turns" in winding 210, and thus increase the inductance of inductor 208. By way of further example, the inductance of inductor 208 can be decreased by removing bonding wires to decrease the number of "turns" in winding 210.

Thus, by increasing or decreasing the number of "turns" in winding 210, the inductance of the invention's inductor 208 can be "fine tuned" to more closely match a required inductance in a particular application. For example, in the development phase of an LC resonance circuit, bonding wires can be removed or added to "fine tune" the inductance of inductor 208 to obtain a particular resonance frequency. Thus, the present invention's inductor 208 provides the flexibility to allow the number of "turns" in winding 210 to vary as required to produce an inductance in a range of approximately 1.0 nH to 100.0 $\mu$H.

As shown in FIG. 2, substrate bond pad 216, also referred to as a "terminal" of inductor 208 in the present application, is connected to trace metal segment 222 to provide a connection to a first end of winding 210. As discussed above, a second end of bonding wire 250 is bonded to substrate bond pad 218 to provide a connection to a second end of winding 210. Substrate bond pads 216 and 218 are fabricated on top surface 204 of substrate 206 in a similar manner as substrate bond pads 116 and 118 described above. Substrate bond pad 216 can be wire bonded to a semiconductor die bond pad, such as semiconductor die bond pad 126 in FIG. 1, or a substrate bond pad, such as substrate bond pad 128. Similarly, substrate bond pad 218 can be wire bonded to a semiconductor die bond pad, such as semiconductor die bond pad 136 in FIG. 1, or a substrate bond pad, such as substrate bond pad 132. In another embodiment, substrate bond pad 216 or substrate bond pad 218 can be connected to a component on top surface 204 of substrate 206, such as a capacitor.

Continuing with FIG. 2, core 212 is situated over insulator 214 (or "insulator layet" 214) but under bonding wires 220, 238, 240, 242, 244, 246, 248, and 250. Core 212 can be secured to top surface 204 of substrate 206 by glue. However, other methods known in the art may be used to attach core 212 to top surface 204 of substrate 206. In the present embodiment, core 212 is housed on top surface 204 of substrate 206, which also houses a semiconductor die, such as semiconductor die 102 in FIG. 1. In other embodiments, core 212 may be housed in a pin grid array package, a ball grid array package, a land grid array package, or on a laminate PCB. In the present embodiment, length 252 of core 212 can be approximately 20.0 mils, width 256 can be approximately 10.0 mils, and thickness 254 can be approximately 10.0 mils. In another embodiment, length 252 can be approximately 40.0 mils, width 256 can be approximately 15.0 mils, and thickness 254 can be approximately 10.0 mils.

Core 212, as discussed above, can comprise a ferrite rod that can have a permeability of approximately 40.0 to 100.0. Also, as discussed above, core 212 can increase the inductance of inductor 208 in proportion to the increase in the value of the permeability of core 212. Therefore, inductor 208 can decrease in length and still maintain the same inductance by proportionally increasing the permeability of core 212. Moreover, in the manner described in relation to FIG. 1, inductor 208 in FIG. 2 can be fine-tuned to meet a required inductance in a particular application. FIG. 2 further illustrates an inductor that can provide an inductance in a range of approximately 1.0 nH to 100.0 $\mu$H while maintaining a relatively small size.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, in one embodiment, two inductors, each one similar to inductor 208, can be mounted on a top surface of a substrate to form a transformer. In such instance, the core, i.e. the ferrite rod, of the first inductor can be mounted in close proximity to the core of the second inductor to form a transformer by coupling the magnetic fields generated by the windings of each inductor. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a high inductance inductor in a semiconductor package has been described.

What is claimed is:

1. A structure comprising:
   a substrate having a top surface for receiving a semiconductor die;
   a core of an inductor on said top surface of said substrate;
   a bonding wire passing over said core on said top surface of said substrate, said bonding wire being connected to a conductor situated under said core, said bonding wire and said conductor together forming one turn of an inductor winding around said core of said inductor.

2. The structure of claim 1 wherein said conductor is patterned onto said top surface of said substrate.

3. The structure of claim 1 wherein an insulator layer is situated between said core and said conductor.

4. The structure of claim 3 wherein said insulator layer comprises solder mask.

5. The structure of claim 1 wherein said core comprises a high permeability material.

6. The structure of claim 5 wherein said high permeability material comprises a ferrite rod.

7. A structure comprising:
   a substrate having a top surface for receiving a semiconductor die;
   a plurality of conductors patterned onto said substrate;
   an insulator layer over said plurality of conductors;
   a core situated over said insulator layer;
   a plurality of bonding wires over said core, at least one of said plurality of bonding wires connecting a first conductor in said plurality of conductors to a second conductor in said plurality of conductors so as to form an inductor winding around said core.

8. The structure of claim 7 wherein a first terminal of said inductor winding is a first substrate bond pad coupled to one of said plurality of bonding wires and wherein a second terminal of said inductor winding is a second substrate bond pad coupled to one of said plurality of conductors.

9. The structure of claim 8 wherein said first terminal of said inductor winding is further coupled to a semiconductor die bond pad.

10. The structure of claim 7 wherein said insulator layer comprises solder mask.

11. The structure of claim 7 wherein said core comprises a high permeability material.

12. The structure of claim 11 wherein said high permeability material comprises a ferrite rod.

13. The structure of claim 7 wherein a first terminal of said inductor winding is coupled to a semiconductor die bond pad.

14. A structure comprising:
   a semiconductor die attached to a top surface of a substrate;
   a plurality of conductors patterned onto said substrate adjacent to said semiconductor die;
   an insulator layer over said plurality of conductors;
   a core situated over said insulator layer;
   a plurality of bonding wires around said core, at least one of said plurality of bonding wires connecting a first conductor in said plurality of conductors to a second conductor in said plurality of conductors so as to form an inductor winding around said core;
   a first terminal of said inductor winding being coupled to a first semiconductor die bond pad of said semiconductor die.

15. The structure of claim 14 wherein a second terminal of said inductor winding is a substrate bond pad coupled to one of said plurality of conductors.

16. The structure of claim 15 wherein said substrate bond pad is coupled to a second semiconductor die bond pad.

17. The structure of claim 14 wherein said insulator layer comprises solder mask.

18. The structure of claim 14 wherein said core comprises a high permeability material.

19. The structure of claim 18 wherein said high permeability material comprises a ferrite rod.

20. A structure comprising:
   a substrate having a top surface for receiving a semiconductor die;
   a plurality of conductors patterned onto said substrate;
   an insulator layer over said plurality of conductors;
   a core situated over said insulator layer;
   a plurality of bonding wires over said core, at least one of said plurality of bonding wires connecting a first conductor in said plurality of conductors to a second conductor in said plurality of conductors so as to form an inductor winding around said core, said inductor winding having a first terminal and a second terminal;
   said first terminal of said inductor winding being a first substrate bond pad coupled to one of said plurality of bonding wires and said second terminal of said inductor winding being a second substrate bond pad coupled to one of said plurality of conductors.

21. The structure of claim 20 wherein said first terminal of said inductor winding is further coupled to a semiconductor die bond pad.

22. A structure comprising:
   a substrate having a top surface for receiving a semiconductor die;
   a plurality of conductors patterned onto said substrate;
   an insulator layer over said plurality of conductors;
   a core situated over said insulator layer;
   a plurality of bonding wires over said core, at least one of said plurality of bonding wires connecting a first conductor in said plurality of conductors to a second conductor in said plurality of conductors so as to form an inductor winding around said core, said inductor winding having a terminal;
   said terminal of said inductor winding being coupled to a semiconductor die bond pad.

* * * * *